United States Patent
Oh et al.

(10) Patent No.: US 11,449,969 B2
(45) Date of Patent: Sep. 20, 2022

(54) IMAGE PROCESSING METHOD IN WIRELESS CHANNEL ENVIRONMENT

(71) Applicant: WiseJet Inc., Daejeon (KR)

(72) Inventors: InnYeal Oh, Daejeon (KR); ByeongNam Ahn, Yongin-si (KR)

(73) Assignee: WISEJET INC., Daejeon (KR)

( * ) Notice: Subject to any disclaimer, the term of this patent is extended or adjusted under 35 U.S.C. 154(b) by 224 days.

(21) Appl. No.: 16/941,373

(22) Filed: Jul. 28, 2020

(65) Prior Publication Data
US 2021/0224959 A1 Jul. 22, 2021

(30) Foreign Application Priority Data

Jan. 17, 2020 (KR) ........................ 10-2020-0006697

(51) Int. Cl.
*G06T 5/00* (2006.01)
*G06T 5/20* (2006.01)
*H04L 1/00* (2006.01)

(52) U.S. Cl.
CPC ................ *G06T 5/005* (2013.01); *G06T 5/20* (2013.01); *H04L 1/0057* (2013.01)

(58) Field of Classification Search
CPC ......... G06T 5/005; G06T 5/20; H04L 1/0057; H04L 1/0047; H03M 13/353; H03M 13/6312; H04N 19/132; H04N 19/166; H04N 19/176; H04N 19/86; H04N 19/895; H04N 21/2383; H04N 19/139; H04N 19/65; H04N 19/89; H04N 21/4382
See application file for complete search history.

(56) References Cited

U.S. PATENT DOCUMENTS

| | | | |
|---|---|---|---|
| 8,819,525 B1 * | 8/2014 | Holmer | H04L 1/007 714/775 |
| 2005/0138532 A1 * | 6/2005 | Park | H04N 19/513 375/E7.266 |
| 2007/0216763 A1 * | 9/2007 | Rossholm | H04N 19/182 375/E7.193 |
| 2010/0226262 A1 * | 9/2010 | Liu | H04N 21/2402 370/312 |
| 2016/0142728 A1 * | 5/2016 | Wang | H04N 19/51 375/240.16 |
| 2017/0070753 A1 * | 3/2017 | Kaneko | H04N 19/50 |
| 2019/0045223 A1 * | 2/2019 | Levy | H04N 19/137 |

FOREIGN PATENT DOCUMENTS

KR 10-1995-0002254 A 1/1995

* cited by examiner

*Primary Examiner* — Christopher M Brandt
(74) *Attorney, Agent, or Firm* — Rabin & Berdo, P.C.

(57) ABSTRACT

A method of image processing in wireless channel environment comprises steps of: dividing a frame of content image data into multiple blocks defined by a line; wirelessly transmitting the multiple blocks per line by coding channels in channel coding units by defining a transmission code rate according to a wireless channel environment information; determining whether there is a channel error for each block after decoding a received data; extracting an information of an image of an errored block; determining an image error correction method suitable for the extracted information; replacing the errored block with an error-corrected block according to the determined image correction method; and performing a post processing process to eliminate visual unnaturalness between the replaced block and a neighboring block at a block boundary.

9 Claims, 11 Drawing Sheets

IMAGE PROCESSING METHOD IN WIRELESS CHANNEL ENVIRONMENT

BACKGROUND OF THE INVENTION

1. Field of the Invention

The present invention relates to an image processing method in wireless environment, and more particularly, to an image processing method for improving the quality of a received image by correcting an error of the image received in a wireless channel environment.

2. Description of the Prior Art

In image communication, image data is coded in a transmitter, transmitted through wired or wireless channels, decoded in a receiver, and displayed on a user's device after channel decoding and image decoding.

Unlike wired transmission, when transmitting images wirelessly, an error occurs during transmission according to various unpredictable wireless environments such as fading, shading, attenuation, noise, or interference, and some or all of the received images are broken causing image quality problems. This occurs frequently, and when the image is broken due to an error, a user is dissatisfied with the image quality.

A method of handling errors that occur during a channel transmission process is retransmitting the data using ARQ (Automatic Repeat reQuest) and a forward error correction (FEC) method in which channel coding is performed by inserting extra additional information, and an error location can be found and corrected immediately by channel decoding at a receiver.

The ARQ is effective for handling errors but takes time for retransmission requests and retransmissions, and is not suitable for real-time communication. The FEC has low data transmission efficiency because extra information necessary for error correction must be sent with a data.

In general, when a forward error correction method is applied to a wireless channel environment, a channel code rate transmitted wirelessly may be defined and processed according to a wireless environment that changes frequently.

If a wireless environment is bad, a code rate, which is a redundancy bit rate for the data bit, can be increased to overcome the bad wireless environment by increasing an error correction ability, but the image quality can be reduced due to the smaller image data rate transmitted by the redundancy bit rate, and if the wireless environment is good, the image quality can be reduced and more image data can be sent to increase the image quality.

A forward error correction method is a coding technology that corrects bit errors on a communication channel based on received information, and includes block code, convolution code, turbo code, parity check, LDPC, etc.

Apart from the ARQ and the FEC technology that directly processes errors during channel transmission, there is an image geometry error correction method that compensates for errors in a current frame by utilizing image data from a the front frame or rear frame of a received frame by mitigating or reducing the effect of errors in an image by slowly changing images according to the frame.

In the case of motionless or very slow images, if there is an error in an image of a current frame received, an image geometry error correction method can be used to correct the image by replacing it with a front or back frame of the current frame without errors, but in fast-moving images, it is replaced by another image that is not similar to that of the current frame, creating an unnatural image.

SUMMARY OF THE INVENTION

The present invention reduces transmission errors by adjusting a transmission data rate by considering the quality of the images transmitted according to a wireless environment, and if there is a transmission error, an image geometry error correction method that corrects the error in the current frame by utilizing the image data in the front frame or the current frame of the received image frame, can be used along with a forward error correction method that sends extra data to the image data from a transmitter.

According to an aspect of the invention to achieve the object described above, a method of image processing in wireless channel environment comprises steps of: dividing a frame of content image data into multiple blocks defined by a line; wirelessly transmitting the multiple blocks per line by coding channels in channel coding units by defining a transmission code rate according to a wireless channel environment information; determining whether there is a channel error for each block after decoding a received data; extracting an information of an image of an errored block; determining an image error correction method suitable for the extracted information; replacing the errored block with an error-corrected block according to the determined image correction method; and performing a post processing process to eliminate visual unnaturalness between the replaced block and a neighboring block at a block boundary.

In a case of a content image based on a user motion and head tracking information, the image error correction method comprises steps of: acquiring an information on a position of an error block in a current frame and the number of error blocks; detecting a current user motion and head tracking information; calculating a position of a block in a previous frame for a current error block to obtain image information as many as the number of blocks; and replacing the current error block with the block in a previous frame.

Preferably, the current user motion and head tracking information is detected from a motion sensor in a receiver or a display.

The content images with image information on moving speed and moving direction of images in frames, lines, or blocks are coded.

The image error correction method based on a moving speed and moving direction of an image is corrected using blocks and lines of a previous frame in which the moving speed and moving direction information is reflected.

A coded channel unit is determined by any one of at least one block or at least one line according to a wireless channel environment.

A channel coding unit varies depending on a type of content as well as an environment.

Blocks per line, a data transmission rate, and a code rate are defined according to a content type, a moving degree of an image, and an environment.

In a case of no information on a moving speed and a moving direction of a current block, where the image error correction method is to replace with the same position block on a top or bottom line of a current frame, rather than the block on the same position of a previous frame of an error image block.

When the number of lines in which an error occurs in a current frame exceeds a predetermined threshold, the image error correction method replaces data in units of frames

Effect of the Invention

An image quality can be improved by solving or mitigating the problem of the image quality deterioration due to a break in all or part of the image received due to errors in transmission depending on a wireless channel environment that changes frequently.

DETAILED DESCRIPTION OF THE EXEMPLARY EMBODIMENTS

Embodiments of the present invention are described in detail by reference to accompanying drawings, but the present invention is not limited by the embodiments.

The present invention concerns how to calibrate images in wireless image transceivers that wirelessly transmit images from source devices to display devices.

Figure 1:
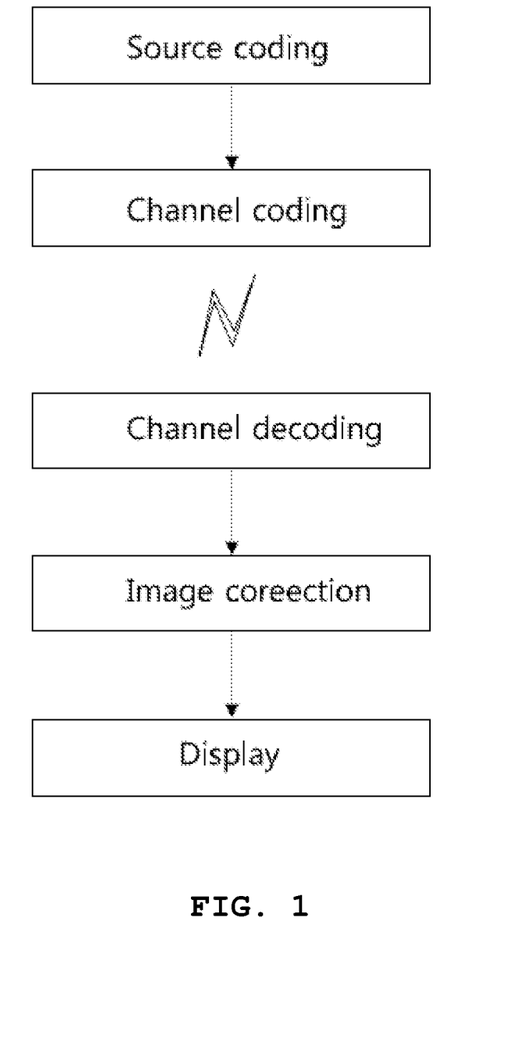
FIG. 1 shows a flow chart of image error correction method in a transmitter and receiver according to an embodiment of the present invention.

FIG. 1 shows a flow chart of image error correction method in a transmitter and receiver according to an embodiment of the present invention.

In order to maintain image quality of a receiver, a transmitter increases or decreases an error recovery rate, i.e. by varying code rate to define an effective data throughput per second in channel coding, and by varying an image error correction method according to the type of error and the degree of motion of the image on the receiver.

If quality of a radio channel is good and the error rate is low, and some of the decoded images are error-prone, image data from the front frame of the received current frame or from the front/back line of the current frame can be used to correct the image data by replacing the line of the current frame with the same position of the front frame or the front/back line of the current frame.

In a case of a burst error that causes a large number of data errors at once, the replacement of the lines is also unnatural image correction. Therefore, instead of processing data in a single line unit, an image is corrected by dividing a line into several pieces of blocks on a single line such as FIG. 2, and by replacing only small blocks where an error occurred.

Figure 2:
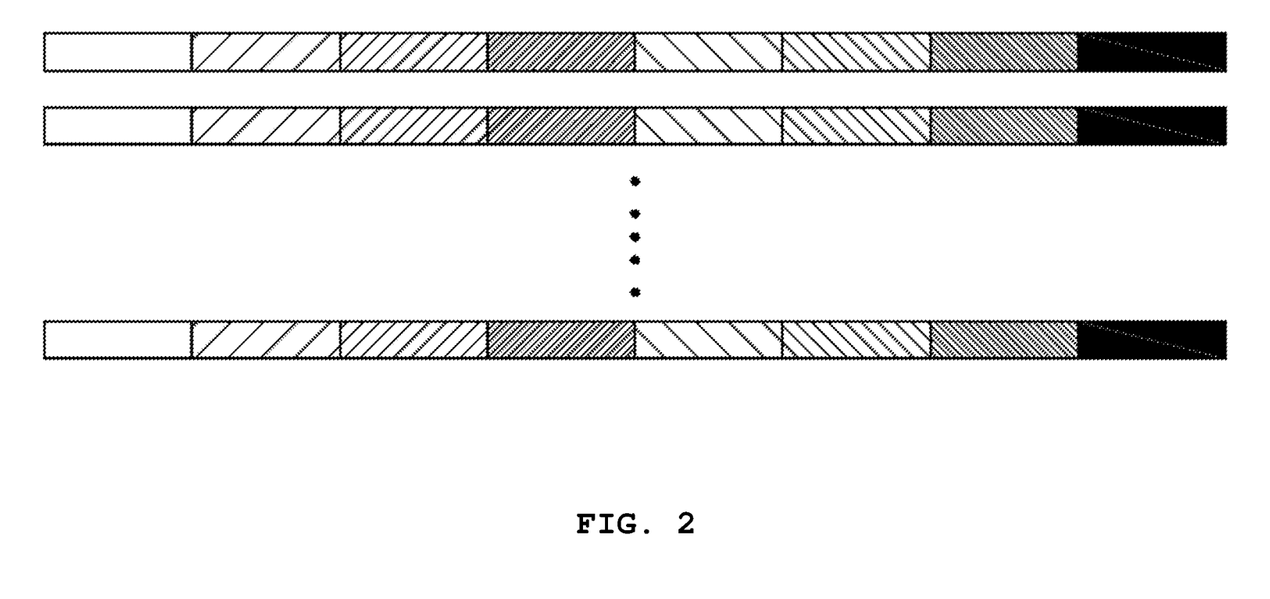
FIG. 2 shows an image picture consisting of a combination of lines in blocks according to an embodiment of the present invention.

Image source coding and channel coding are performed in units of image blocks divided into several pieces, and only blocks that cannot be restored from a receiving side channel decoder are replaced by blocks of the same line of the front and back lines or front frames.

Figure 3:
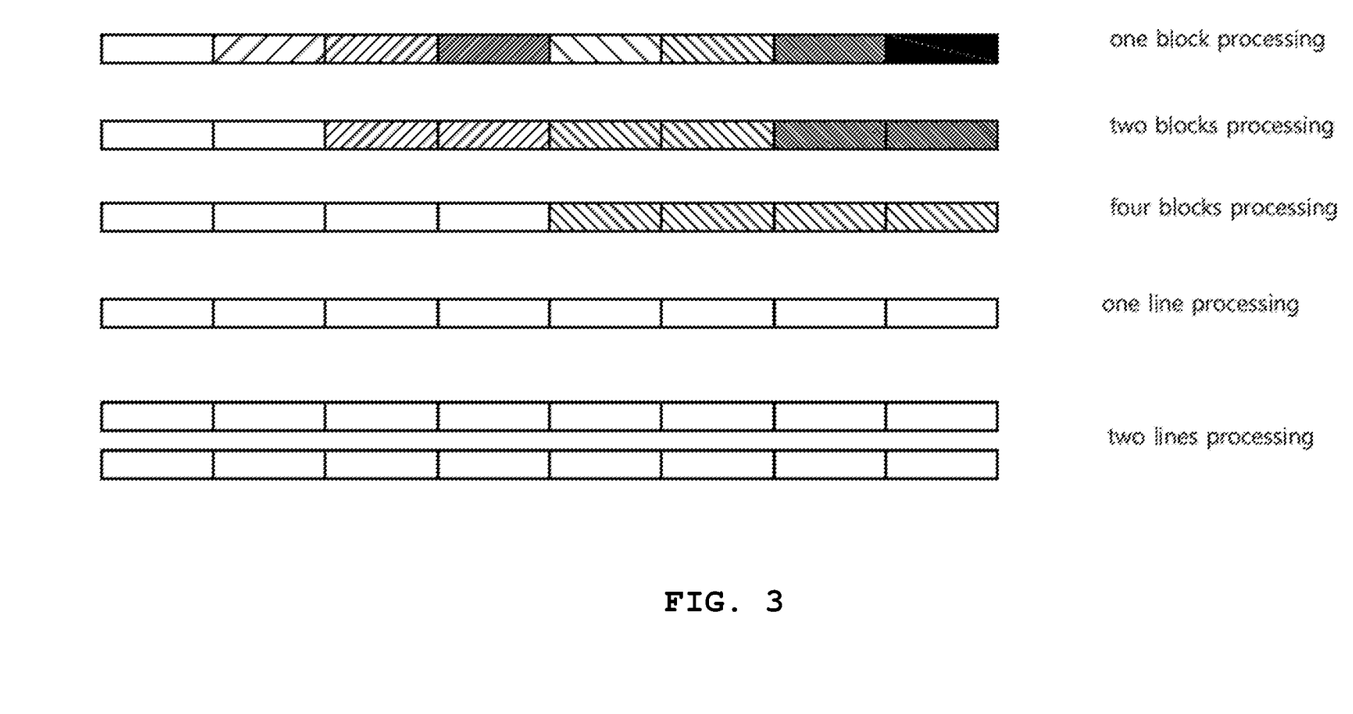
FIG. 3 shows different configurations of the number of blocks per line according to an embodiment of the present invention.

Replacing images in a block unit to correct errors improves image resiliency, but reduces an amount of data processing due to the large amount of redundancy information entering each block. If a channel environment is good, high-quality image quality can be obtained by increasing data processing rate depending on the type of content and the use environment where errors occur by processing channel coding in two, four blocks or one line, as shown in FIG. 3, and processing image block corrections.

Figure 4:
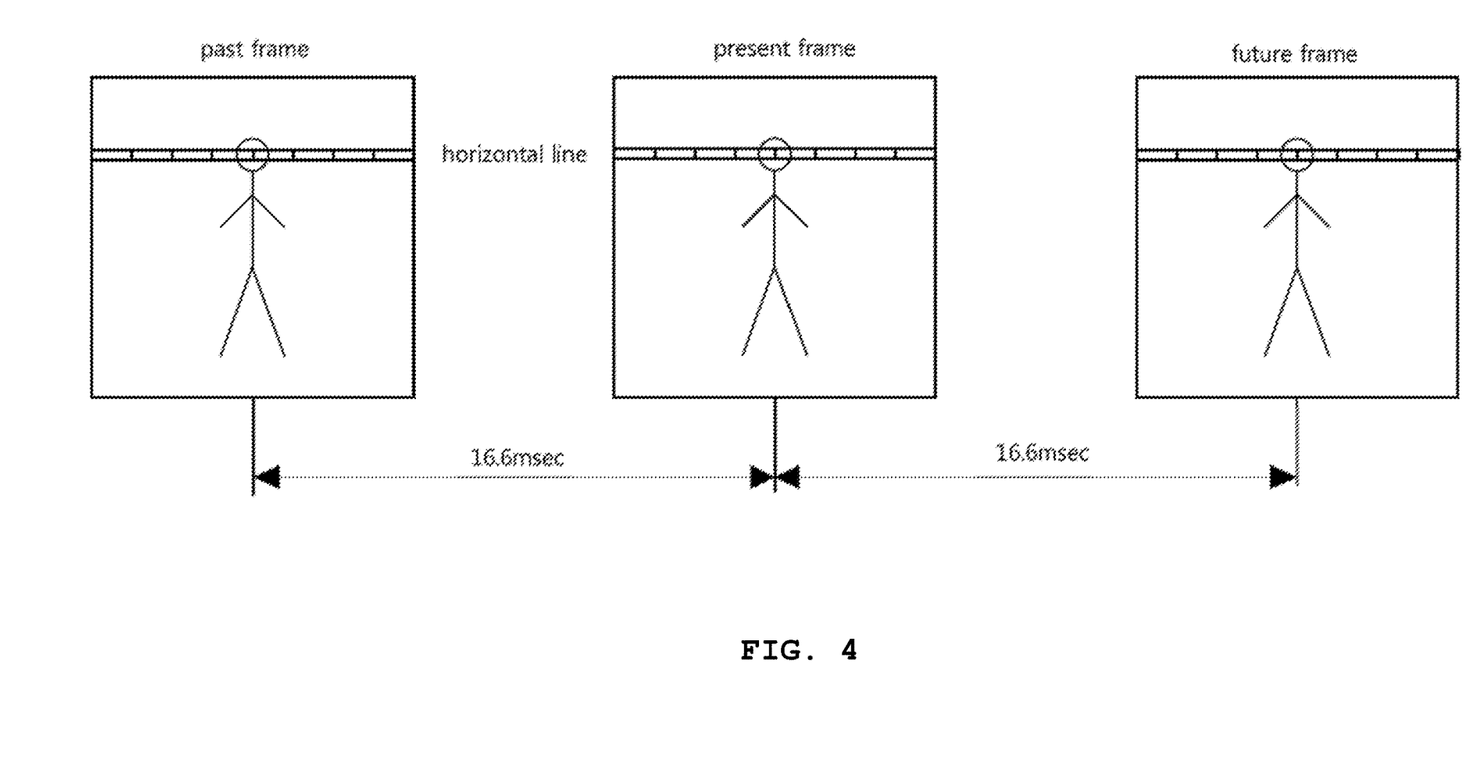
FIG. 4 shows past, present and future frames in motionless images according to an embodiment of the present invention.

Referring to FIG. 4, since an image received at a receiving side is a 60 Hz frame image per second, and a still picture is a 60 Hz frame rate as shown. The past, present, and future frames shown with a time difference of 16.6 msec for each frame are all the same.

In the case of a still picture or a very slow moving picture, the image is corrected by replacing only the block in error with the block at the same position in the previous frame.

In addition, a code rate regulation of image block definition and channel coding can further improve image quality by periodically sending a received error rate to a transmitter to recognize a current channel situation when an environmental change event occurs so that the transmitter can analyze a frequency of error occurrence and adjust the code rate and block number per line.

A moving image is different from a stationary picture or very slow-moving image.

Figure 5:
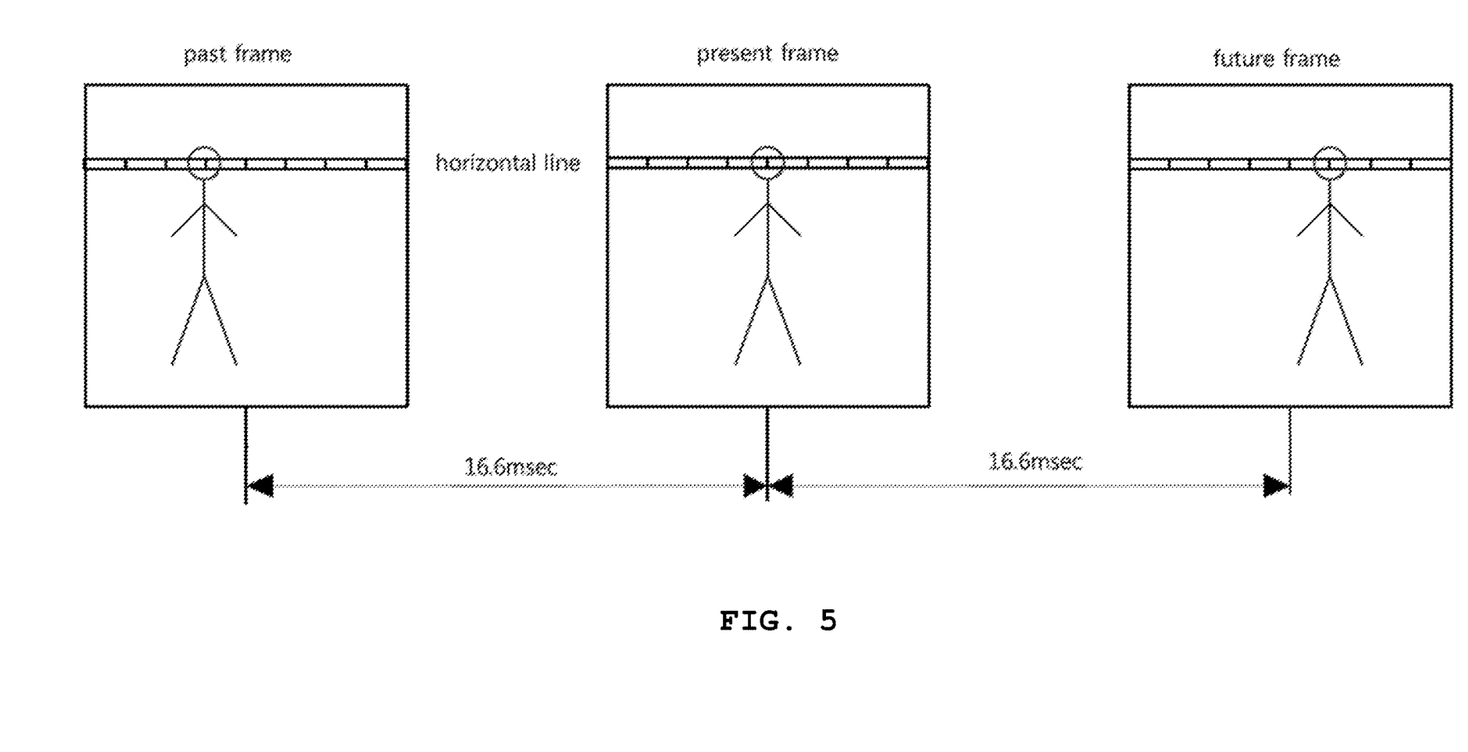
FIG. 5 represents block and line concept of past, present and future frames in an image in which a person moves to the right according to an embodiment of the present invention.

Referring to FIG. 5, there is a high probability that a wrong picture will be replaced if an image is corrected by replacing only a small unit block with a block of equal position in the front frame with an error on a picture with a motion.

In a moving image, by increasing the number of blocks per horizontal line so that the block length is shorter than the moving distance due to the moving speed between a current frame and a previous frame, only a small unit block in error is replaced with the block at the same position in the previous frame. An image can be corrected, but the number of blocks per line of a suitable size is required because a transmitted data rate increases as the number of header information increases by the number of blocks.

However, replacing an erroneous line or block with a line or block in the same position is difficult to restore to a better image quality in a fast-moving image.

Figure 6:
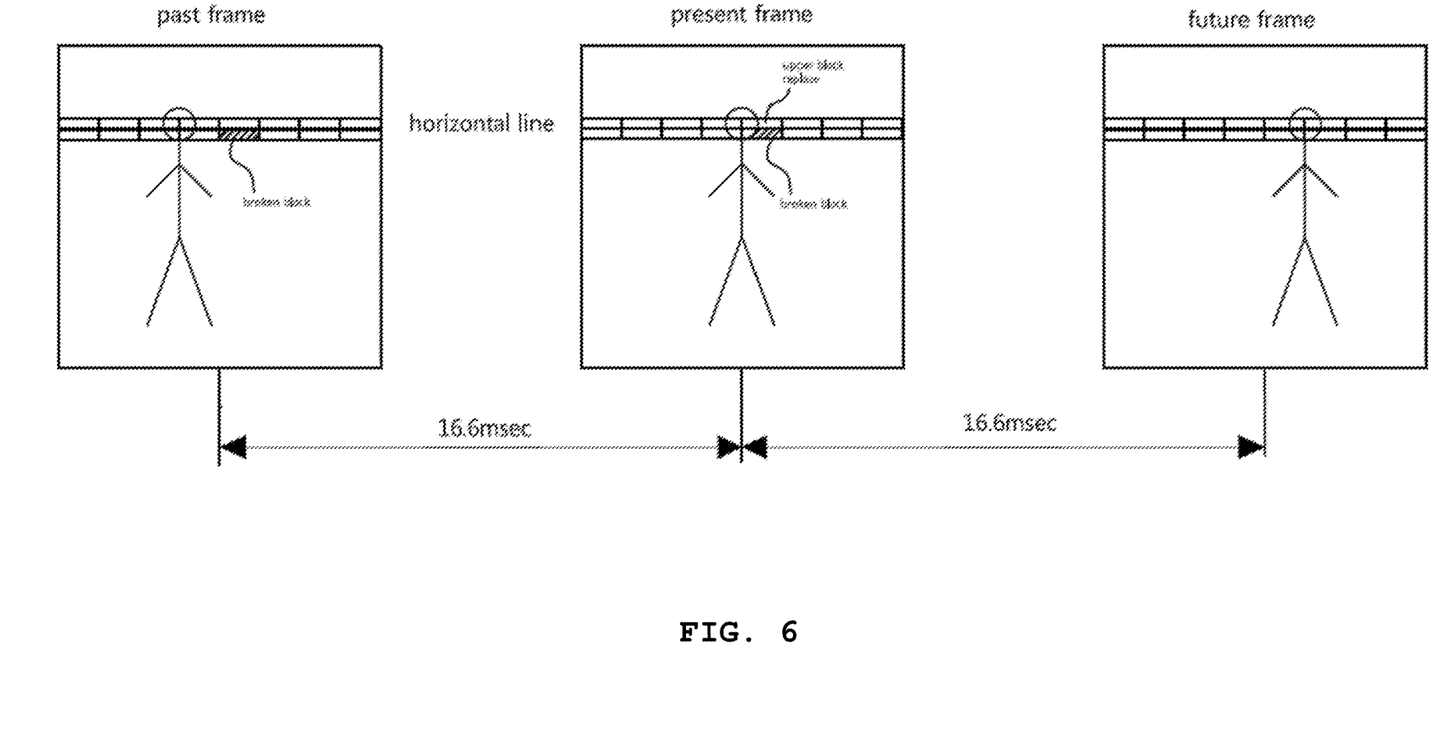
FIG. 6 shows that it is advantageous to calibrate the image to the same position block of the previous line of the current frame in an image in which a person moves to the right, rather than the block of the same position of the past frame.

As shown in FIG. 6, in the image of a 60 Hz frame per second and 1920×1080 line, if a field of view (FOV) is left-right 100°, an image of a rapid angular velocity that moves 800° per second in a horizontal direction will appear with a change of 13.28° (per 16.6 msec) per frame (800°× 0.0166 sec).

In this case, an incorrect calibration is performed if an image correction is made by replacing a block in the same position of a line in the same position of the previous frame, as shown in FIG. 5. In any case, it is difficult to expect better quality images, even if corrected with incorrect information, however, it is the same as the quality of the broken image. This is why it is advantageous in images where, as shown in FIG. 6, an image is calibrated with the same position block on the line before or after the broken block of the current frame, not with the frame of the past.

Therefore, in the case of fast-moving image (sports, games, etc.) it is replaced by a block in the same position as the front and back lines or the current frame of the line where an error occurred.

In a wireless environment, a large number of burst errors occur in which a large amount of errors occur. When upper and lower lines are lost together due to a cluster error, the desired image quality cannot be obtained when the current line is replaced with the upper line.

In such cases, replacing the previous line with the same line of the previous frame is a better way to improve the quality of the image.

In general, there is a greater possibility of data error when a transmitting/receiving device is in motion than when it is inactive, and when the moving camera image is transmitted in real time wirelessly or when an image that reflects a movement such as head tracking is transmitted, it may be a wireless transmission environment condition in which multiple errors occur due to movement.

In this case, if an image is corrected by replacing a block with the error by reflecting the image correction as much as the direction of motion (up/down, left/right) and the moving speed, the corrected image is much better quality.

Image correction in fast-moving images is divided into two main categories.

The first is image correction in an image that reflects motion and head tracking, and the second is image correction in an image that has motion.

Firstly, virtual reality (VR) and augmented reality (AR) applications that enjoy images that reflect movements and head tracking provide 3D image information that reflects the movements of a HMD in a source such as game PC according to head movement and motion movement of the VR/AR-HMD mounted on the head.

Image information of a current frame versus a previous frame is determined by the direction of HMD motion and the speed of movement, so that the current frame is visible, reflecting the direction and speed of HMD movement.

An image error correction method in image reflecting motion and head tracking-based motion in such image viewing environment can improve image quality by performing image correction based on the current frame, as it can predict the position of image information in the previous frame based on the direction and speed information based on the user's motion sensor based on this information.

Figure 7:
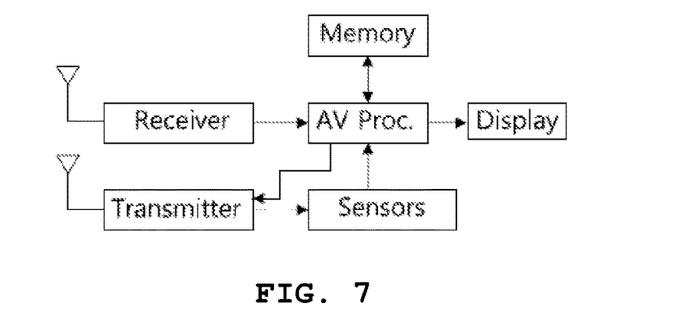
FIG. 7 shows a system block diagram that can restore error-causing image information by recognizing the direction and speed of user movement in the system that displays images that reflect user movement according to an embodiment of the present invention.
Figure 8:
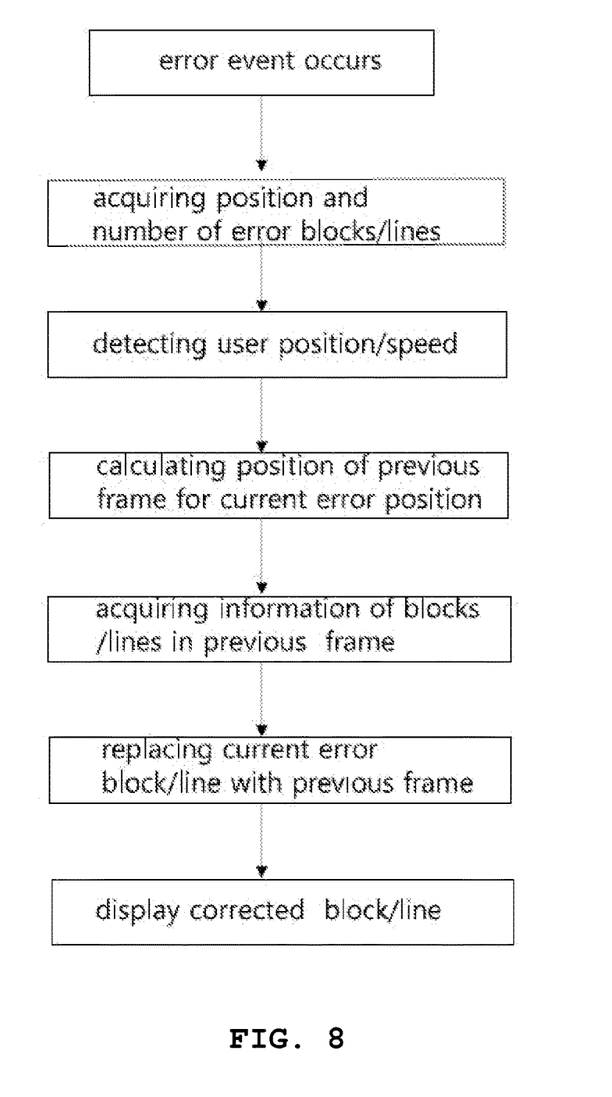
FIG. 8 shows a signal flow chart that restores image errors in a system that displays images that reflect user movements according to an embodiment of the present invention.

A wireless AR/VR system structure is as shown in FIG. 7, and the sequence of error correction based on motion and head tracking is as shown in FIG. 8.

Secondly, unlike an image that reflects motion and head tracking-based movements, if the image is moving, the moving direction and speed information must be included to correct errors in the same way. In order to improve the quality of images in a wireless transmission environment, images with motion in image information can be transmitted by adding moving direction and speed information to image information in frames, lines, or blocks of content to support image correction on a receiving side.

For this purpose, the moving direction and speed information of frame, line, or block unit are also sent when transmitting image information so that meaningful error correction is made when an error occurs upon receipt.

The moving speed information required for correction of errors in blocks with errors upon receipt can be obtained by using the moving speed information of blocks around which errors occurred.

Figure 9:
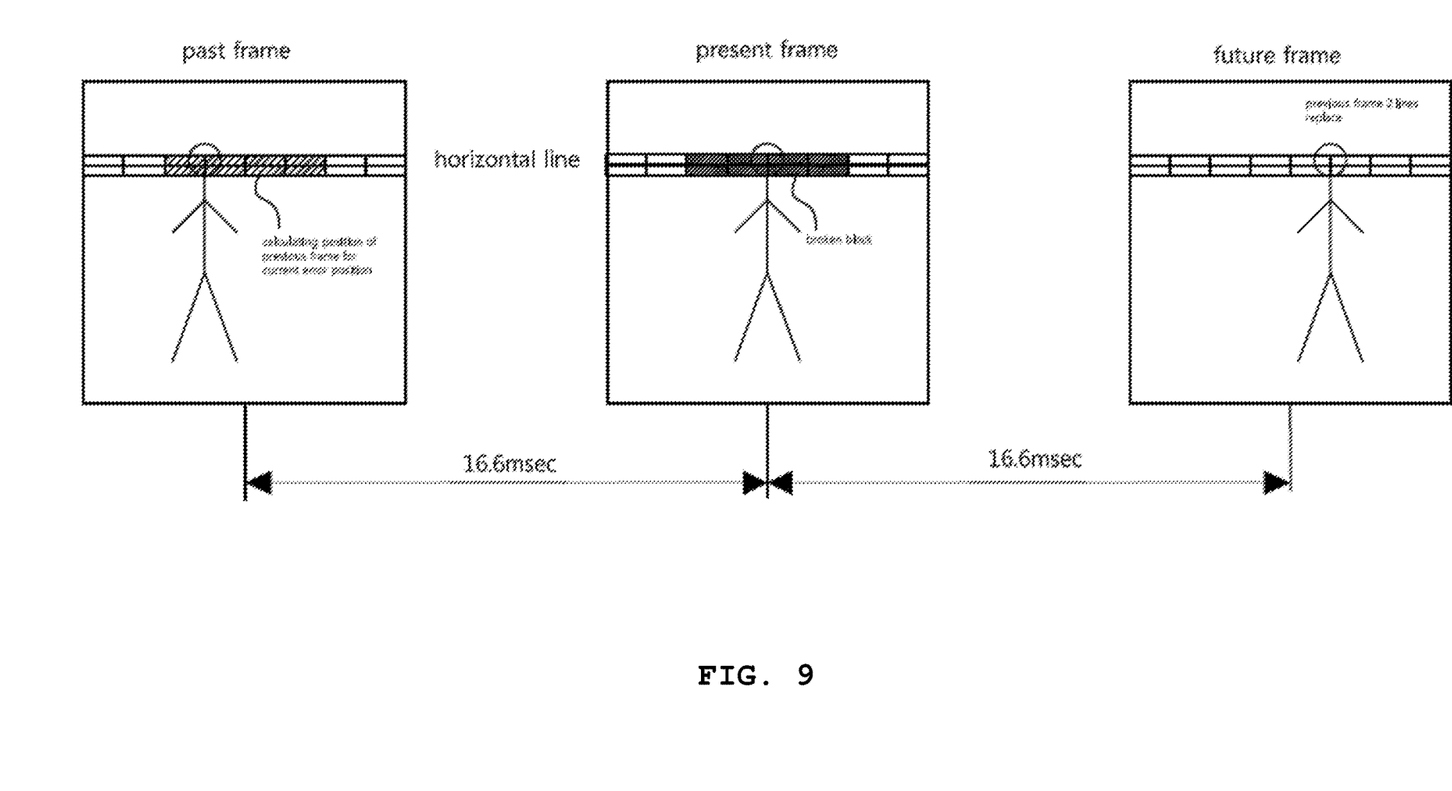
FIG. 9 indicates that the image position of the current frame's error-causing block and line in the image with motion according to an embodiment of the present invention is a different image in the same position of the past frame and in the same position of the past frame.
Figure 10:
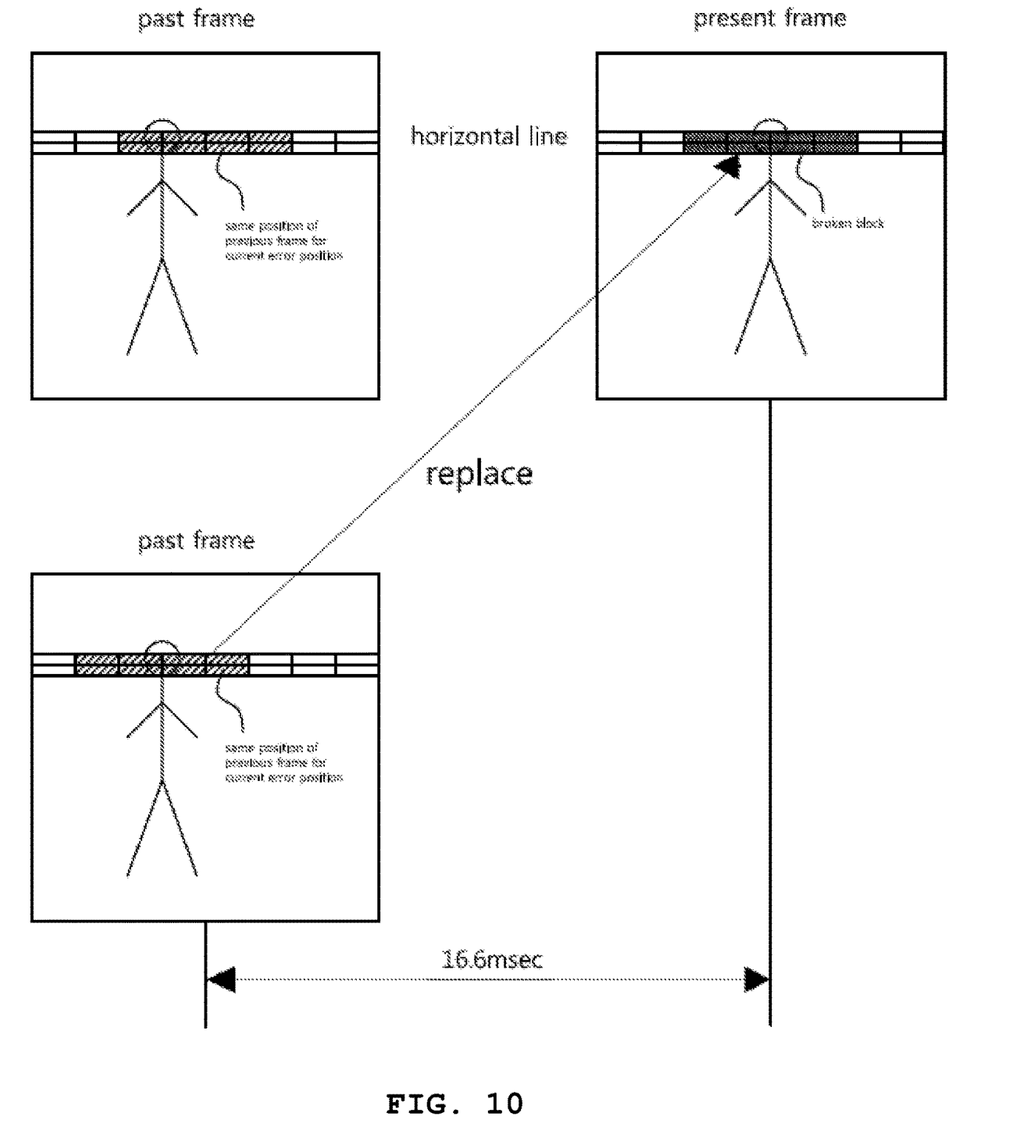
FIG. 10 shows that the image position of the current frame's error-causing block and line in the image with motion according to an embodiment of the present invention is the image of the block and line in a position that reflects the direction and speed of motion, not the block and line in the same position in the past frame.
Figure 11:
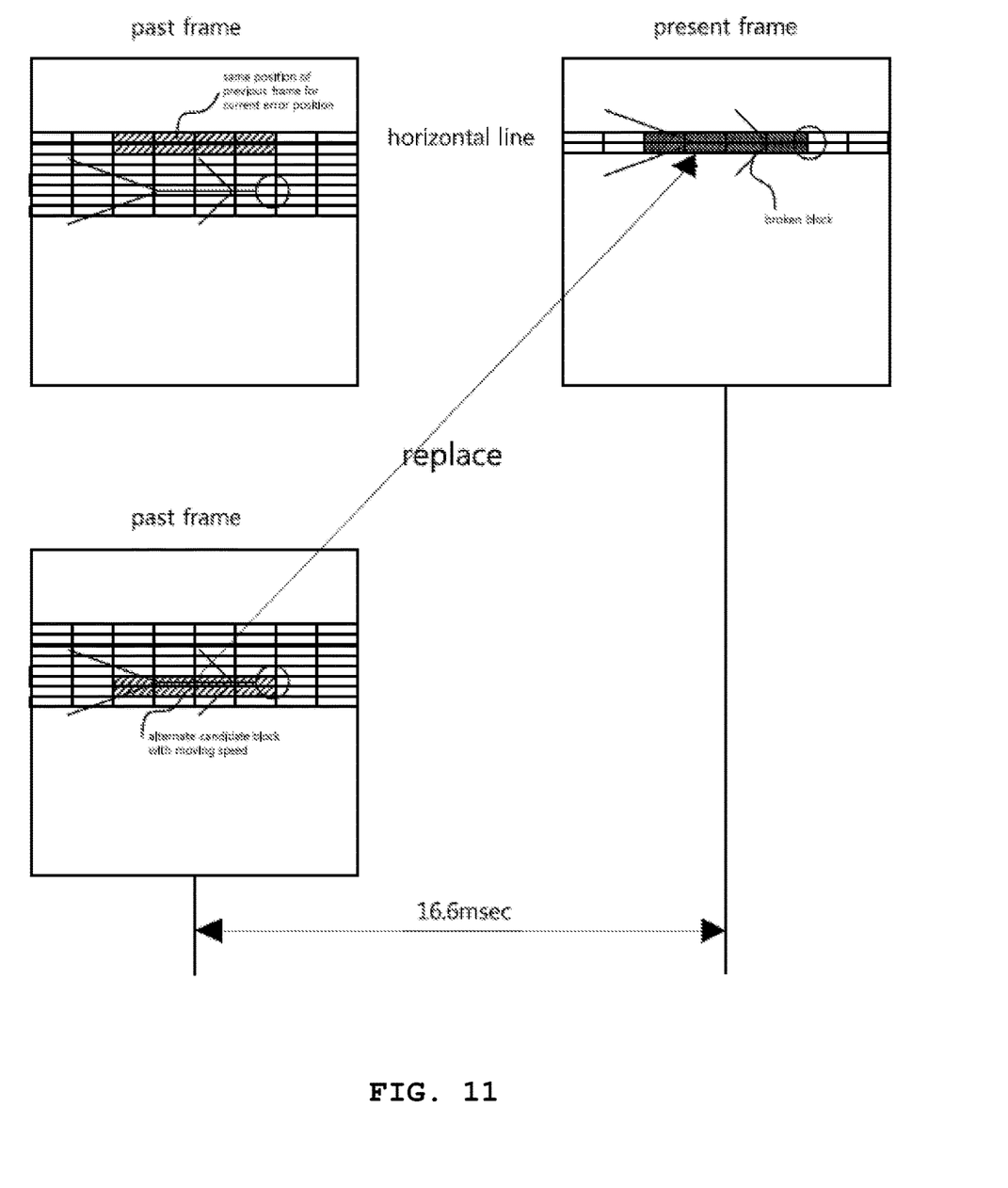
FIG. 11 shows that the image of the current frame's error-causing block and line position in the image moving up and down according to an embodiment of the present invention is the image of the block and line in a position that reflects the direction and speed of movement of the past frame.

Examples of error correction of the motion images for the above two are shown in FIGS. 9 and 10, and examples of error correction when the moving directions may be different are shown in FIG. 11.

Referring to FIG. 9, in the image of a 60 Hz frame per second, and in the image of a 1080 line with a left/right FOV of 100°, 800° per second in a horizontal direction, an image with a change of 13.28° (per 16.6 msec) per frame (for 800°×0.0166 sec).

Assuming eight piece blocks per line at FOV of 100°, one block is composed of 12.5° and one line represents a total of 100°, so at 13.28° moving beyond 12.5°, the error blocks in the current frame are replaced with blocks reflecting the movement of the previous frame to compensate the images.

If the moving direction and speed of the image are recognized and the speed of the image motion differs by 0.5 to 1.5 times (6.25~18.75°) the speed of one block (12.5°), the quality of the image can be obtained by replacing the error blocks of the current frame with one previous block of the past frame.

In a case of image information moving from left to right as in the example of FIG. 10, when a motion moves at a speed of 0.5 to 1.5 times that of one block, the error block of the current frame is replaced with the block previous to one block of the previous frame. In the case of image information moving to the left, if the motion moves at a speed of 0.5 to 1.5 times that of one block, the error block of the current frame is replaced with the block after one block of the previous frame, and the image moving from left to right due to the fast moving speed. When an information movement shows 1.5 to 2.5 times the difference of one block, the previous frame is replaced with the previous block two blocks of the previous frame.

In a case of image information moving from the bottom to the top as in the example of FIG. 11, it is assumed that the FOV of the top and bottom is 100°, and if the picture is a horizontal 1080 line, there is a movement of 0.0925° per one line.

In a case of moving image information from the bottom to the top, if the moving speed is 0.5 to 1.5 times the speed of one line, the current frame is replaced by the line below the line of the previous frame. When moving at a speed of 0.5 to 1.5 times the speed of one line, the current frame is replaced by the line above one line of the previous frame, and the moving speed of the image information moving from the bottom to the top is 1.5 times the speed of one line. If the difference is 2.5 times, the line below 2 lines of the previous frame is replaced with the current frame.

If a motion angular velocity of an error block is 0.5 to 1.5 times the FOV indicated by the block constituting each line, the previous/post/up/down block (or line) of the previous frame may be replaced depending on the direction of movement.

Although the examples described above have been described based on a case where a frame rate is 60 Hz, the frame rate is differently used as 30 Hz, 60 Hz, 90 Hz, and 120 Hz for each device and application. For each frame rate, the time difference between each frame is 33.3 msec for 30 Hz, 16.6 msec for 60 Hz, 11.1 msec for 90 Hz, and 8.3 msec for 120 Hz.

In addition, the number of horizontal and vertical lines that are scan lines during a time period during which one frame appears is different for each display device. For example, horizontal lines vary from 720 to 1080, 1200, 3240 for each display device or for each type of produced image, and thus the time difference between each line display is different. In an image correction reflecting a moving speed, the corresponding error block should be replaced by reflecting this time difference.

A calculation formula for determining the relative position of a block of a previous frame with respect to a current block in order to select a candidate block to replace in order to conceal the block in which the current error occurred for the above-mentioned various cases is as follows.

For the various cases exemplified above, the calculation formula for determining the position relative to the current block of the candidate block of the previous frame to replace in order to conceal the block in which the current error occurred is as follows.

$$\text{Number of horizontal moving blocks} = Vh*(Nb/(Nf*FOV))$$

where, Vh=Horizontal moving speed of image)(°
Nb=Number of unit blocks per line
Nf=Frames per second
FOV=Field of view (°)

$$\text{Number of vertical moving lines} = Vv*(Nl/(Nf*FOV))$$

where, Vv=Vertical moving speed of image)(°
Nl=Number of lines per frame
Nf=Frames per second
FOV=Field of view (°)

Here, Vh and Vv are the horizontal and vertical moving speeds obtained by dividing the moving speed into horizontal and vertical components, and when the moving direction is from left to right and from bottom to top, it has a positive (+) value and from the right. It has a negative value when it is directed from left to top and down.

In addition, the number of horizontal moving blocks and the number of vertical moving lines are calculated by rounding off the decimal point.

When a block with an error is replaced with a candidate block, a post-processing process may be performed to eliminate visual unnaturalness between a replaced block and a neighboring block at a block boundary.

The post-processing process may determine whether the difference in color and intensity of the normal block of the boundary surface of the block with errors is occurring significantly above a threshold, and if it occurs above the threshold, a border pixel of the error block may include the color of the boundary pixel of the normal block and a method of post-processing with an intensity value of average.

In a severe error environment in which an image cannot be restored even when image correction is processed in line units due to an error in a wireless channel, a still image may be maintained to prevent the image from being severely deteriorated.

The severe error environment may include a case in which the number of lines in which an error occurs in the current frame exceeds a predetermined threshold (E_max) or a number in which a burst error occurs in a block exceeds a predetermined threshold (Eb_max).

In the present invention, unlike a transmission speed and frame structure used in SDI and display port, a data processing speed and frame structure suitable for radio transmission environment are defined and used for wireless transmission.

If a channel environment is not good, it reduces an amount of data by lowering a resolution, frame, depth, etc. along with channel coding and image correction, and can have a stable wireless communication environment with low transmission rate (narrowband communication). When the wireless environment is poor, stable communication is possible by performing narrow-band communication.

Figure 12:
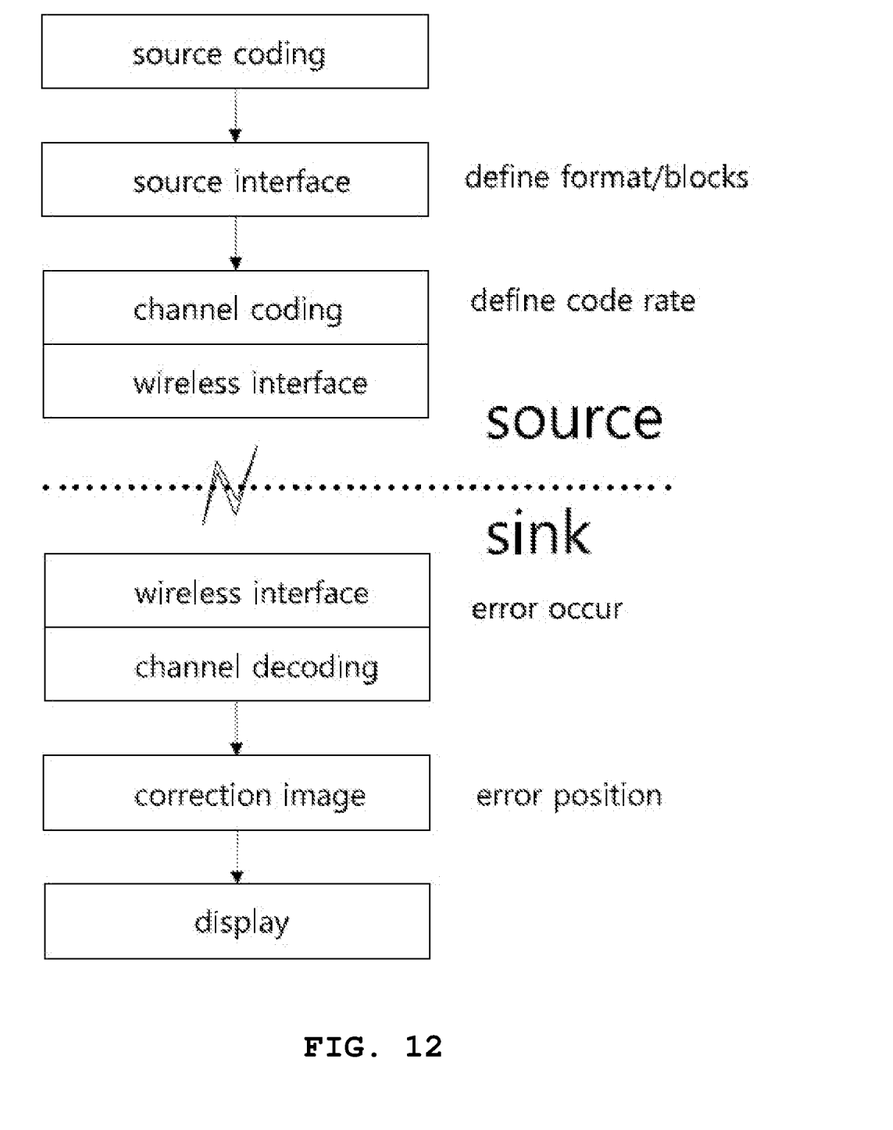
FIG. 12 is a diagram of the image correction system according to an embodiment of the present invention.

FIG. 12 shows a wireless interface used in the present invention. Unlike SDI (3/6 Gbps) and displayport (2.7/5.4 Gbps), a processing speed per lane is set as a standard, a resolution, frame, and depth are adjusted according to the wireless environment. In accordance with the amount of data obtained, wireless transmission is performed at a data processing speed within a maximum transmission rate, and the larger the error occurs, the more the number of blocks per line is increased or a protection rate is increased to stipulate a transmission/reception system to cope with the error.

Among error information, while performing image correction based on an error location information, the error frequency information is transmitted in a reverse direction to a source unit, and based on this, the code rate of channel coding suitable for a channel environment is defined as well as when coding a source. Source coding such as image resolution, frame, and depth is performed to define a wireless transmission rate based on error information so that wireless communication is advantageous for a channel environment. In addition, block units per line to be processed for image correction are defined based on error information.

As described above, a transmission rate suitable for a wireless channel environment is defined by a source format, a number of blocks per line, and a channel coding code rate, and a wireless device defines a wireless modulation method capable of accommodating a transmission rate to perform final data transmission.

In a source coding, not only the channel environment is considered, but also sports, games, or movie content types can be recognized, and the number of blocks per line can be defined by reflecting this. Image correction is performed using the up and down blocks (lines).

What is claimed is:
1. A method of image processing in wireless channel environment comprising:
   dividing a frame of content image data into multiple blocks defined by a line;
   forming multiple blocks per line according to wireless channel environment information, and wirelessly transmitting by channel coding in channel coding units based on a defined transmission code rate;
   determining whether there is a channel error for each block after channel decoding received data;
   extracting information from an image of an errored block;
   determining an image error correction method suitable for the extracted information;
   replacing the errored block with an error-corrected block according to the determined image error correction method; and performing a post processing process to eliminate visual unnaturalness between the error-corrected block and a neighboring block at a block boundary, wherein, in case of a content image based on user motion and head tracking information, the image error correction method comprises:

acquiring information on a position of an error block in a current frame and a number of error blocks;

detecting a current user motion and head tracking information;

calculating a position of a block in a previous frame for a current error block to obtain image information as many as the number of blocks; and replacing the current error block with the block in a previous frame.

2. The method of claim 1, wherein the current user motion and the head tracking information are detected from a motion sensor in a receiver or a display.

3. The method of claim 1, wherein the content images with the image information on a moving speed and a moving direction of images in frames, lines, or blocks are coded.

4. The method of claim 1, wherein the image error correction method based on a moving speed and a moving direction of an image is corrected using blocks and lines of a previous frame in which the moving speed and moving direction information are reflected.

5. The method of claim 1, wherein a coded channel unit is determined by any one of at least one block and at least one line according to a wireless channel environment.

6. The method of claim 1, wherein a channel coding unit varies depending on a type of content as well as environment.

7. The method of claim 1, wherein blocks per line, a data transmission rate, and a code rate are defined according to a content type, a moving degree of an image, and an environment.

8. The method of claim 1, wherein, in case of no information on a moving speed and a moving direction of a current error block, the image error correction method is configured to replace with the same position block on a top or bottom line of a current frame, rather than the block on the same position of a previous frame of an error image block.

9. The method of claim 1, when a number of lines in which an error occurs in the current frame exceeds a predetermined threshold, the image error correction method replaces data in units of frames.

* * * * *